(12) United States Patent
Lee et al.

(10) Patent No.: US 8,994,099 B2
(45) Date of Patent: Mar. 31, 2015

(54) MULTI-LEVEL CONTACT TO A 3D MEMORY ARRAY AND METHOD OF MAKING

(71) Applicant: Sandisk Technologies Inc., Plano, TX (US)

(72) Inventors: Yao-Sheng Lee, Tampa, FL (US); Zhen Chen, Yokkaichi (JP); Syo Fukata, Yokkaichi (JP)

(73) Assignee: Sandisk Technologies Inc., Plano, TX (US)

( * ) Notice: Subject to any disclaimer, the term of this patent is extended or adjusted under 35 U.S.C. 154(b) by 0 days.

(21) Appl. No.: 14/470,479

(22) Filed: Aug. 27, 2014

(65) Prior Publication Data

US 2014/0367759 A1    Dec. 18, 2014

Related U.S. Application Data

(62) Division of application No. 13/478,483, filed on May 23, 2012, now Pat. No. 8,828,884.

(51) Int. Cl.
*H01L 29/66* (2006.01)
*H01L 23/48* (2006.01)
(Continued)

(52) U.S. Cl.
CPC ........ *H01L 23/481* (2013.01); *H01L 21/76816* (2013.01); *H01L 27/1157* (2013.01); *H01L 27/11575* (2013.01); *H01L 27/11582* (2013.01); *H01L 29/7926* (2013.01); *H01L 27/11* (2013.01)
USPC ..... 257/329; 257/324; 257/328; 257/E29.262

(58) Field of Classification Search
CPC .......................... H01L 29/66666; H01L 29/66
USPC ......... 438/147, 156, 157, 164, 165, 197, 201, 438/209, 211, 212, 213, 216, 242, 257, 259, 438/261, 264, 268, 269, 270, 279, 689, 700, 438/701, 702, 734, 735, 736, 737, 738, 438/740; 257/E21.023, E21.035, E21.246, 257/E21.487, E21.488, E21.587
See application file for complete search history.

(56) References Cited

U.S. PATENT DOCUMENTS

| 5,915,167 A | 6/1999 | Leedy et al. |
| 7,005,350 B2 | 2/2006 | Walker et al. |

(Continued)

FOREIGN PATENT DOCUMENTS

| WO | WO02/15277 A2 | 2/2002 |
| WO | WO2013/176960 A2 | 11/2013 |

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Eduardo A Rodela
(74) *Attorney, Agent, or Firm* — The Marbury Law Group PLLC

(57) ABSTRACT

A method of making multi-level contacts. The method includes providing an in-process multilevel device including at least one device region and at least one contact region. The contact region includes a plurality of electrically conductive layers configured in a step pattern. The method also includes forming a conformal etch stop layer over the plurality of electrically conductive layers, forming a first electrically insulating layer over the etch stop layer, forming a conformal sacrificial layer over the first electrically insulating layer and forming a second electrically insulating layer over the sacrificial layer. The method also includes etching a plurality of contact openings through the etch stop layer, the first electrically insulating layer, the sacrificial layer and the second electrically insulating layer in the contact region to the plurality of electrically conductive layers.

6 Claims, 10 Drawing Sheets

(51) Int. Cl.
*H01L 21/768* (2006.01)
*H01L 27/115* (2006.01)
*H01L 29/792* (2006.01)
*H01L 27/11* (2006.01)

(56) References Cited

U.S. PATENT DOCUMENTS

| | | | |
|---|---|---|---|
| 7,023,739 | B2 | 4/2006 | Chen et al. |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 2003/0011017 | A1 | 1/2003 | Lee et al. |
| 2007/0210338 | A1 | 9/2007 | Orlowski |
| 2007/0252201 | A1 | 11/2007 | Kito et al. |
| 2010/0013049 | A1* | 1/2010 | Tanaka et al. ............ 257/532 |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0031546 | A1 | 2/2011 | Uenaka et al. |
| 2011/0076819 | A1 | 3/2011 | Kim et al. |
| 2011/0133606 | A1 | 6/2011 | Yoshida et al. |
| 2011/0169071 | A1* | 7/2011 | Uenaka et al. ............ 257/326 |
| 2011/0266606 | A1 | 11/2011 | Park et al. |
| 2011/0284943 | A1 | 11/2011 | Hwang et al. |
| 2012/0001247 | A1 | 1/2012 | Alsmeier |
| 2012/0001249 | A1 | 1/2012 | Alsmeier |
| 2012/0001250 | A1 | 1/2012 | Alsmeier |
| 2013/0264631 | A1 | 10/2013 | Alsmeier et al. |
| 2013/0313627 | A1 | 11/2013 | Lee et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

International Search Report and Written Opinion, International Application No. PCT/US2013/041410, issued Dec. 20, 2013, 7pgs.

International Preliminary Report on Patentability received in connection with International Application No. PCT/US2013/041410, mailed Dec. 4, 2014.

* cited by examiner

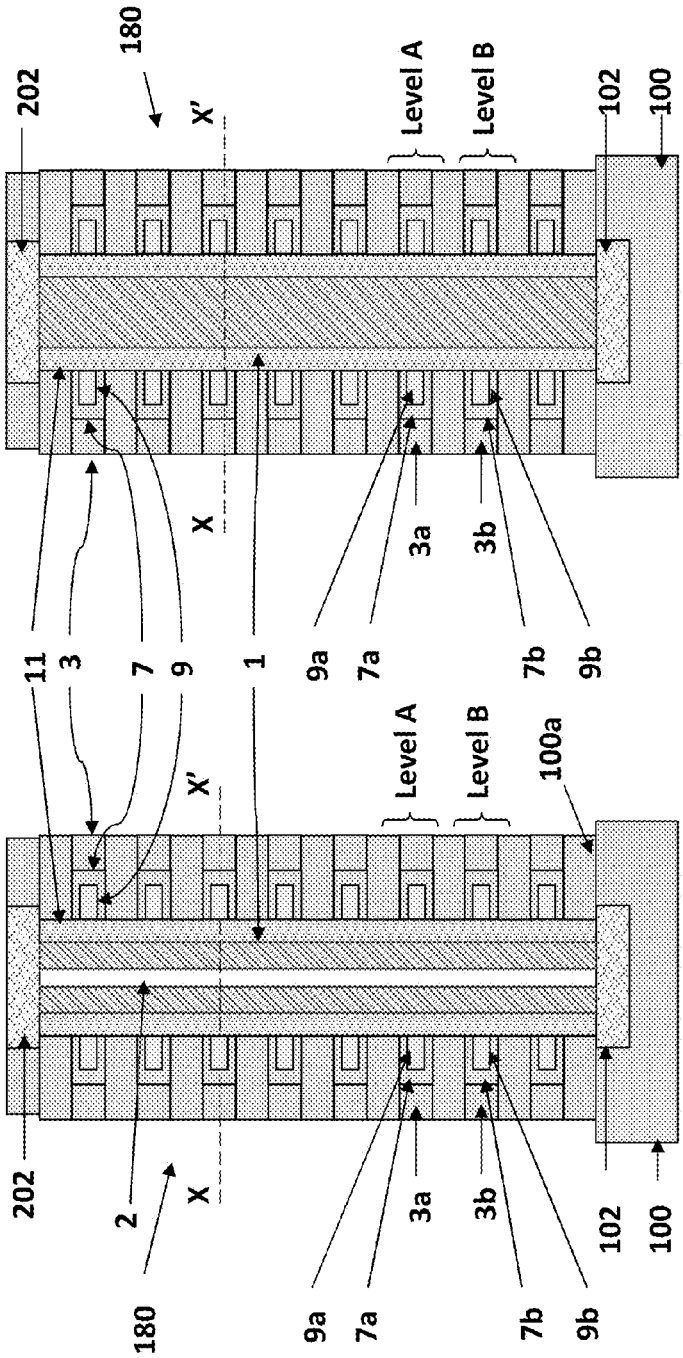

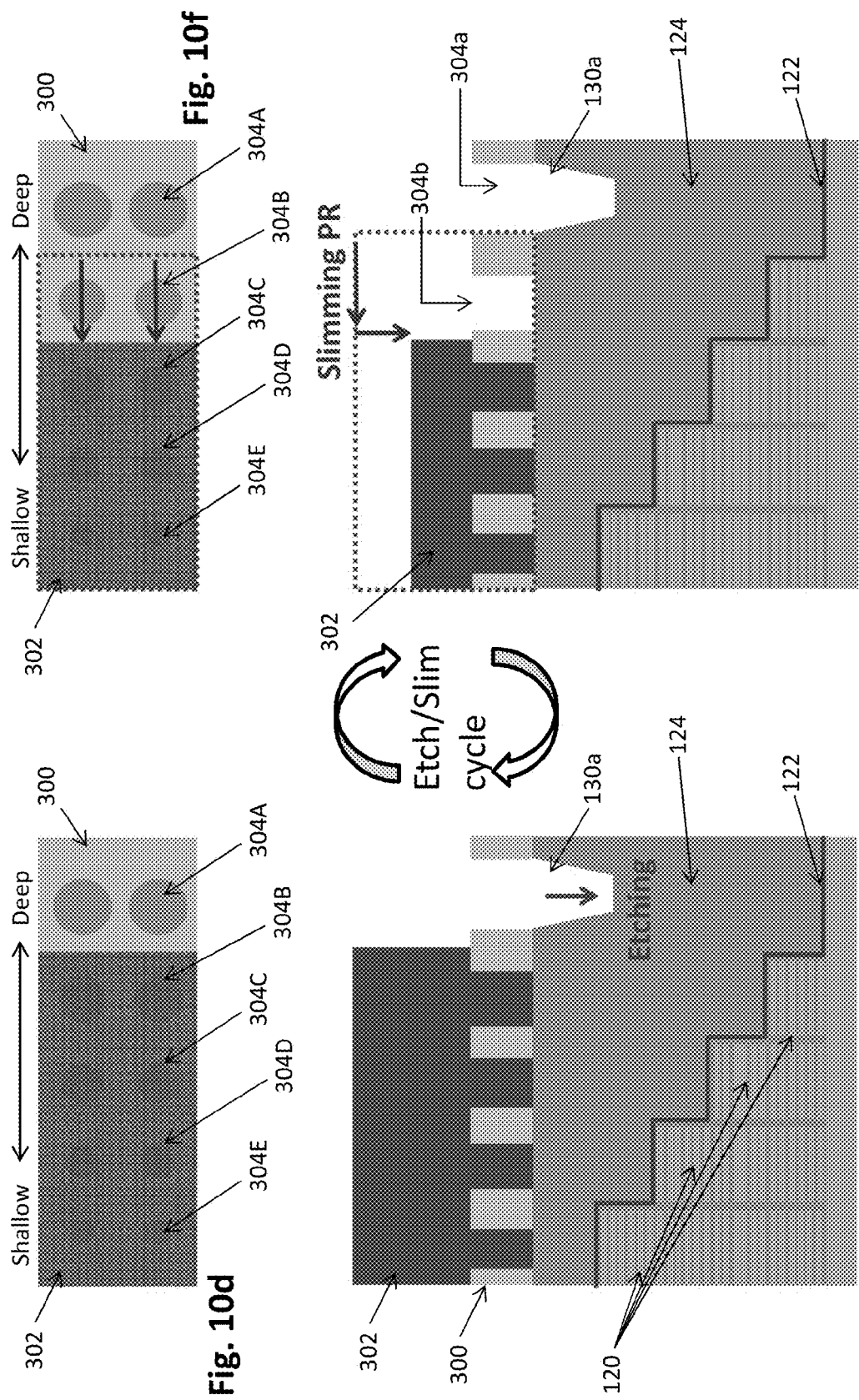

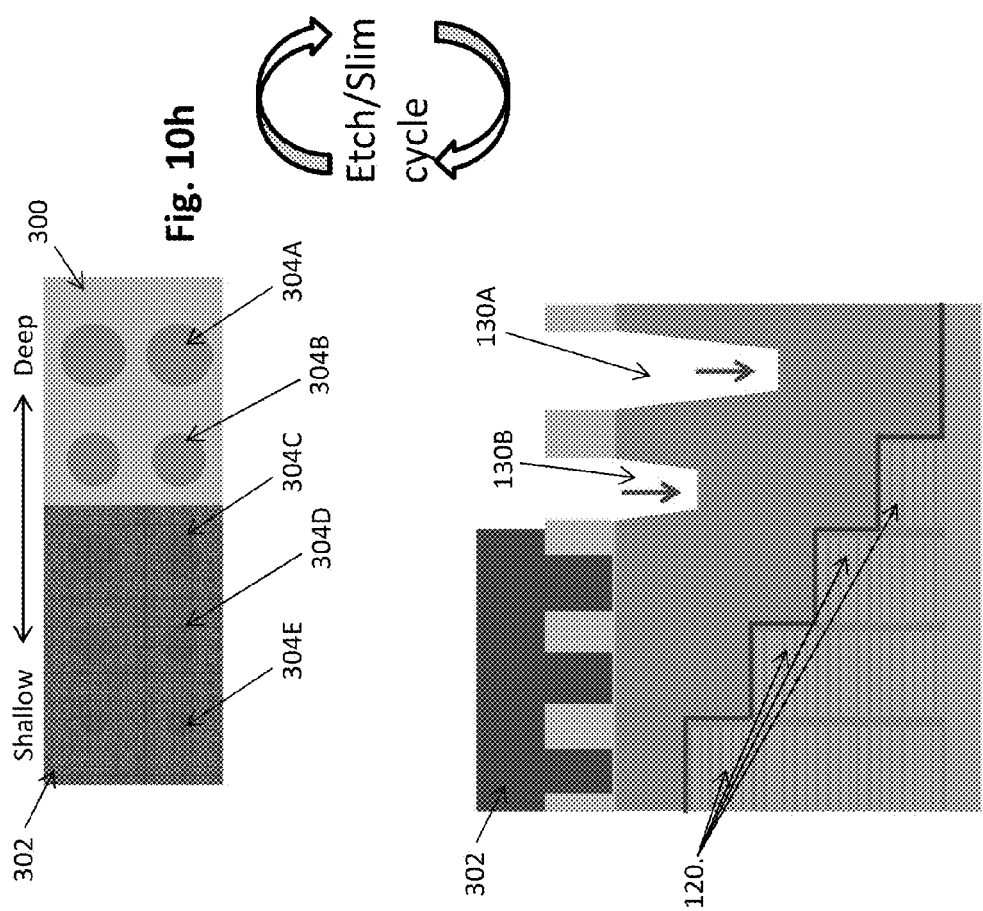

MULTI-LEVEL CONTACT TO A 3D MEMORY ARRAY AND METHOD OF MAKING

FIELD

The present invention relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment relates to a method of making multi-level contacts. The method includes providing an in-process multilevel device including at least one device region and at least one contact region. The contact region includes a plurality of electrically conductive layers configured in a step pattern. The method also includes forming a conformal etch stop layer over the plurality of electrically conductive layers, forming a first electrically insulating layer over the etch stop layer, forming a conformal sacrificial layer over the first electrically insulating layer and forming a second electrically insulating layer over the sacrificial layer. The method also includes etching a plurality of contact openings through the etch stop layer, the first electrically insulating layer, the sacrificial layer and the second electrically insulating layer in the contact region to the plurality of electrically conductive layers.

Another embodiment relates to a method of making multi-level contacts. The method includes providing an in-process multilevel device including at least one device region and at least one contact region. The contact region includes a plurality of electrically conductive layers configured in a step pattern, an electrically insulating layer located over the electrically conductive layers, a mask with a plurality of openings located over the insulating layer and a slimming layer located over the mask. The method also includes etching the slimming layer to reduce its thickness and width to expose a first opening in the mask, etching a portion of the electrically insulating material exposed in the first opening to form a portion of a first contact opening in the electrically insulating material, and further etching the slimming layer to reduce its thickness and width to expose a second opening in the mask.

Another embodiment relates to a multilevel device that includes at least one device region and at least one contact region. The contact regions has a plurality of stacked electrically conductive layers. The electrically conductive layers form a stepped pattern in the contact region. The device also includes a conformal etch stop layer located over the electrically conductive layers, a first electrically insulating layer located over the etch stop layer, a conformal sacrificial layer located over the first electrically insulating layer and a second electrically insulating layer located over the sacrificial layer. The device also includes a plurality of contact openings extending through the etch stop layer, the first electrically insulating layer, the sacrificial layer and the second electrically insulating layer in the contact region to the plurality of electrically conductive layers. The device also includes a plurality of electrically conductive contacts. Each respective one of the plurality of electrically conductive contacts is located in a respective one of the plurality of contact openings, and each electrically conductive contacts is in electrical contact with a respective one of the plurality of electrically conductive layers.

BRIEF DESCRIPTION OF THE DRAWINGS

FIGS. 1A-1B are respectively side cross sectional and top cross sectional views of a NAND string of one embodiment. FIG. 1A is a side cross sectional view of the device along line Y-Y' in FIG. 1B, while FIG. 1B is a side cross sectional view of the device along line X-X' in FIG. 1A.

FIG. 2A-2B are respectively side cross sectional and top cross sectional views of a NAND string of another embodiment. FIG. 2A is a side cross sectional view of the device along line Y-Y' in FIG. 2B, while FIG. 2B is a side cross sectional view of the device along line X-X' in FIG. 2A.

FIGS. 10c-10d are respectively side cross sectional and top cross sectional views of a subsequent step in the method making a multi-level contact of FIGS. 10a-10b.

FIGS. 10e-10f are respectively side cross sectional and top cross sectional views of a subsequent step in the method making a multi-level contact of FIGS. 10a-10b.

FIGS. 10g-10h are respectively side cross sectional and top cross sectional views of a subsequent step in the method making a multi-level contact of FIGS. 10a-10b.

DETAILED DESCRIPTION

Embodiments of the present invention will be described below with reference to the accompanying drawings. It should be understood that the following description is intended to describe exemplary embodiments of the invention, and not to limit the invention.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figures 3, 4:
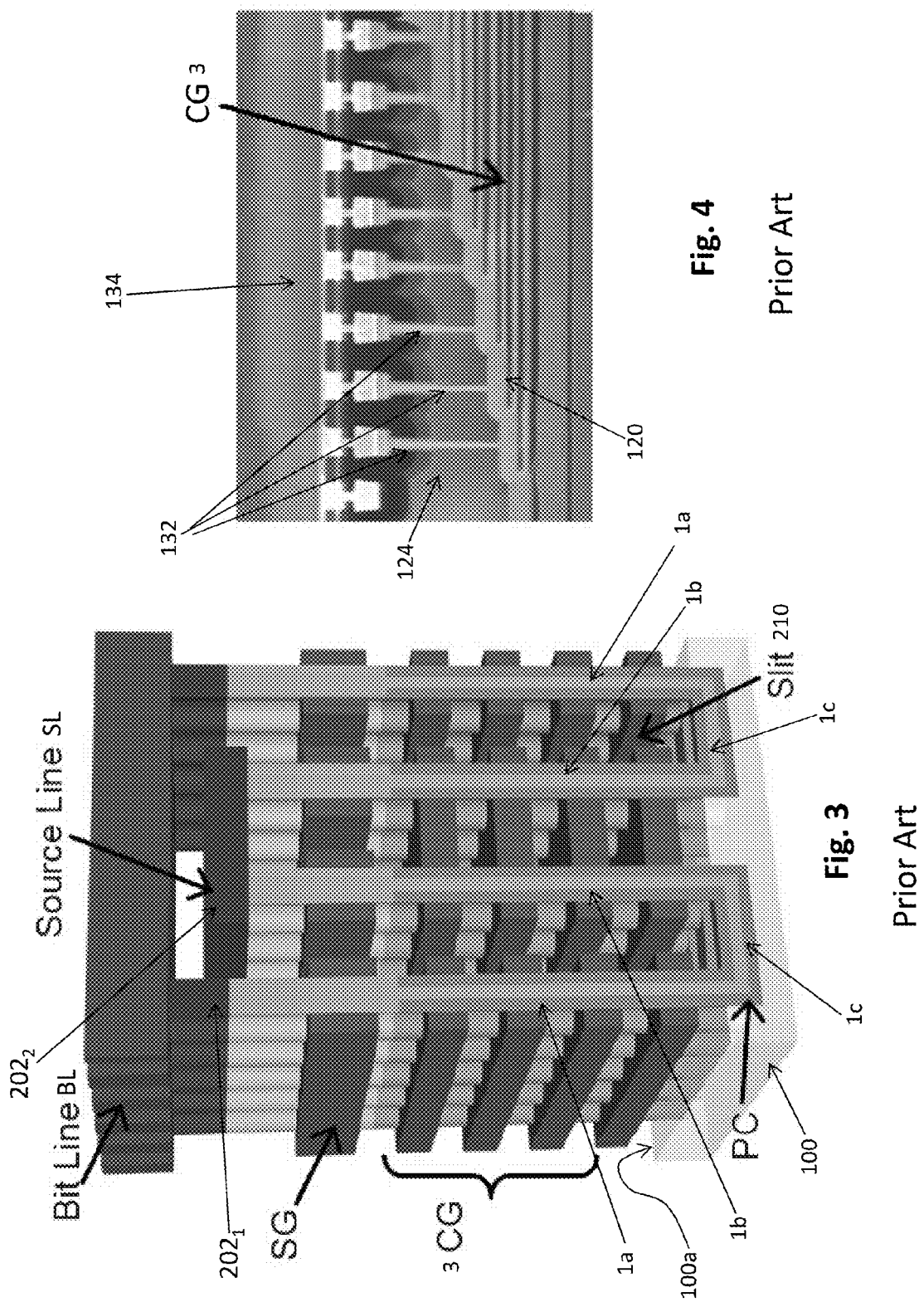
FIG. 3 is a schematic illustration of a conventional NAND string memory device.
FIG. 4 is a scanning electron microscope (SEM) image of a cross-section of a conventional NAND string memory device showing the contacts to the gate electrodes.

Embodiments of the invention relate to methods of making contacts to a multi-level memory array, such as a monolithic 3D array. In an embodiment, the multi-level memory device includes at least one device region in which the memory cells (e.g., vertical NAND strings 180) are located and at least one contact region in which the multi-level contacts are located. As illustrated in FIGS. 3 and 4 and discussed in more detail below, the distal ends of the control gates of a multi-level vertical NAND memory array are arranged in a step-by-step configuration. In this manner, electrical contact to the individual control gates can be achieved by etching an array of openings 130 in the surrounding dielectric layer(s) from the top surface of the memory array down to the steps 120 and depositing contact metal in the openings 130 to contact the steps 120. In conventional methods of fabricating the contacts to the control gates of the multi-level memory array, the more shallow steps may be heavily over-etched before the deepest steps are exposed.

Other embodiments of the invention provide a monolithic, three dimensional array of memory devices, such as an array of vertical NAND strings. The NAND strings are vertically oriented, such that at least one memory cell is located over another memory cell. The array allows vertical scaling of NAND devices to provide a higher density of memory cells per unit area of silicon or other semiconductor material.

In some embodiments, the monolithic three dimensional NAND string 180 comprises a semiconductor channel 1 having at least one end portion extending substantially perpendicular to a major surface 100*a* of a substrate 100, as shown in FIGS. 1A, 2A, and 3. For example, the semiconductor channel 1 may have a pillar shape and the entire pillar-shaped semiconductor channel extends substantially perpendicularly to the major surface 100*a* of the substrate 100, as shown in FIGS. 1A and 2A. In these embodiments, the source/drain electrodes of the device can include a lower electrode 102 provided below the semiconductor channel 1 and an upper electrode 202 formed over the semiconductor channel 1, as shown in FIGS. 1A and 2A. Alternatively, the semiconductor channel 1 may have a U-shaped pipe shape, as shown in FIG. 3. The two wing portions 1*a* and 1*b* of the U-shaped pipe shape semiconductor channel may extend substantially perpendicular to the major surface 100*a* of the substrate 100, and a connecting portion 1*c* of the U-shaped pipe shape semiconductor channel 1 connects the two wing portions 1*a*, 1*b* extends substantially parallel to the major surface 100*a* of the substrate 100. In these embodiments, one of the source or drain regions $202_1$ contacts the first wing portion of the semiconductor channel from above, and another one of a source or drain regions $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string's select gate (SG) or access transistors are shown in FIG. 3. In an embodiment as illustrated in FIG. 3, the source regions $202_2$ of adjacent NAND strings may be connect via a source line SL, while the drain regions $202_1$ of adjacent NAND strings may be connect via a bit line BL. In the U-shaped embodiment, a slit 210 separates the two wing portions 1*a* and 1*b* of the U-shaped pipe shape. The slit 210 maybe filled with a dielectric material.

In some embodiments, the semiconductor channel 1 may be a filled feature, as shown in FIGS. 2A-2B. In some other embodiments, the semiconductor channel 1 may be hollow, for example a hollow cylinder filled with an insulating fill material 2, as shown in FIGS. 1A-1B. In these embodiments, and an insulating fill material 2 may be formed to fill the hollow part surrounded by the semiconductor channel 1.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. materials. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B, and 3. The control gate electrodes 3 may comprise a portion having a strip shape extending substantially parallel to the major surface 100*a* of the substrate 100. The plurality of control gate electrodes 3 comprise at least a first control gate electrode 3*a* located in a first device level (e.g., device level A) and a second control gate electrode 3*b* located in a second device level (e.g., device level B) located over the major surface 100*a* of the substrate 100 and below the device level A. The control gate material may comprise any one or more suitable conductive or semiconductor control gate material known in the art, such as doped polysilicon, tungsten, copper, aluminum, tantalum, titanium, cobalt, titanium nitride or alloys thereof. For example, in some embodiments, polysilicon is preferred to allow easy processing.

A blocking dielectric 7 is located adjacent to and may be surrounded by the control gate(s) 3. The blocking dielectric 7 may comprise a plurality of blocking dielectric segments located in contact with a respective one of the plurality of control gate electrodes 3, for example a first dielectric segment 7*a* located in device level A and a second dielectric segment 7*b* located in device level B are in contact with control electrodes 3*a* and 3*b*, respectively, as shown in FIGS. 1A-1B and 2A-2B. Alternatively, the blocking dielectric 7 may be continuous as shown in FIG. 3.

The monolithic three dimensional NAND string may also comprise a plurality of discrete charge storage segments 9, each of which is located between the blocking dielectric segments 7 and the channel 1. Similarly, the plurality of discrete charge storage segments 9 comprise at least a first discrete charge storage segment 9a located in the device level A and a second discrete charge storage segment 9b located in the device level B. Alternatively, the charge storage segment(s) 9 may be continuous as shown in FIG. 3. That is, the charge storage segments may comprise localized regions in a continuous charge storage layer.

The tunnel dielectric 11 of the monolithic three dimensional NAND string is located between each one of the plurality of the discrete charge storage segments 9 and the semiconductor channel 1. The tunnel dielectric 11 may comprise a plurality of blocking dielectric segments 11 or a continuous layer of dielectric material.

The blocking dielectric 7 and the tunnel dielectric 11 may be independently selected from any one or more same or different electrically insulating materials, such as silicon oxide, silicon nitride, silicon oxynitride, or other high-k insulating materials.

The charge storage segment(s) 9 may comprise a discrete or continuous conductive (e.g., metal or metal alloy such as titanium, platinum, ruthenium, titanium nitride, hafnium nitride, tantalum nitride, zirconium nitride, or a metal silicide such as titanium silicide, nickel silicide, cobalt silicide, or a combination thereof) or semiconductor (e.g., polysilicon) floating gate, conductive nanoparticles, or a discrete or continuous charge storage dielectric (e.g., silicon nitride or another dielectric) feature. For example, in some embodiments, the discrete charge storage segments 9 are discrete charge storage dielectric features, each of which comprises a nitride feature located in the respective clam-shaped blocking dielectric segment 7, where the silicon oxide blocking dielectric segment 7, the nitride feature 9 and the silicon oxide tunnel dielectric 11 form oxide-nitride-oxide discrete charge storage structures of the NAND string. Alternatively, a polysilicon floating gate may be used.

FIG. 4 is a scanning electron microscope (SEM) image that illustrates a cross-section of a conventional vertical NAND memory device. As illustrated in FIG. 4, the contacts 132 extend from a top surface of a contact region 134 to the gate electrode steps 120 of the control gates 3. As discussed in more detail below, the contacts 132 are made by filling vias formed in an electrically insulating (dielectric) material 124 with an electrically conducting material, such copper or aluminum or their silicides. To form the step pattern illustrated in FIG. 4, the control gate electrodes 3 are configured such that a first conductive layer (e.g., a lower layer in the stack of layers) includes a portion that laterally extends past a second conductive layer (e.g., a higher layer in the stack). The contact openings include a first contact opening (e.g., 130A, in FIG. 7) that extends to the first portion of the first conductive layer (e.g., 120a) and a second contact opening (e.g., 130B in FIG. 7) extends to an upper surface of the second conductive layer (e.g., 120b). For example, the first conductive layer (e.g., 120a) may be a portion of a first control gate electrode 3 which extends from the device region to the contact region 134 and the second conductive layer (e.g., 120b) may be a portion of a second control gate electrode 3 which extends from the device region to the contact region 134.

Figure 5:
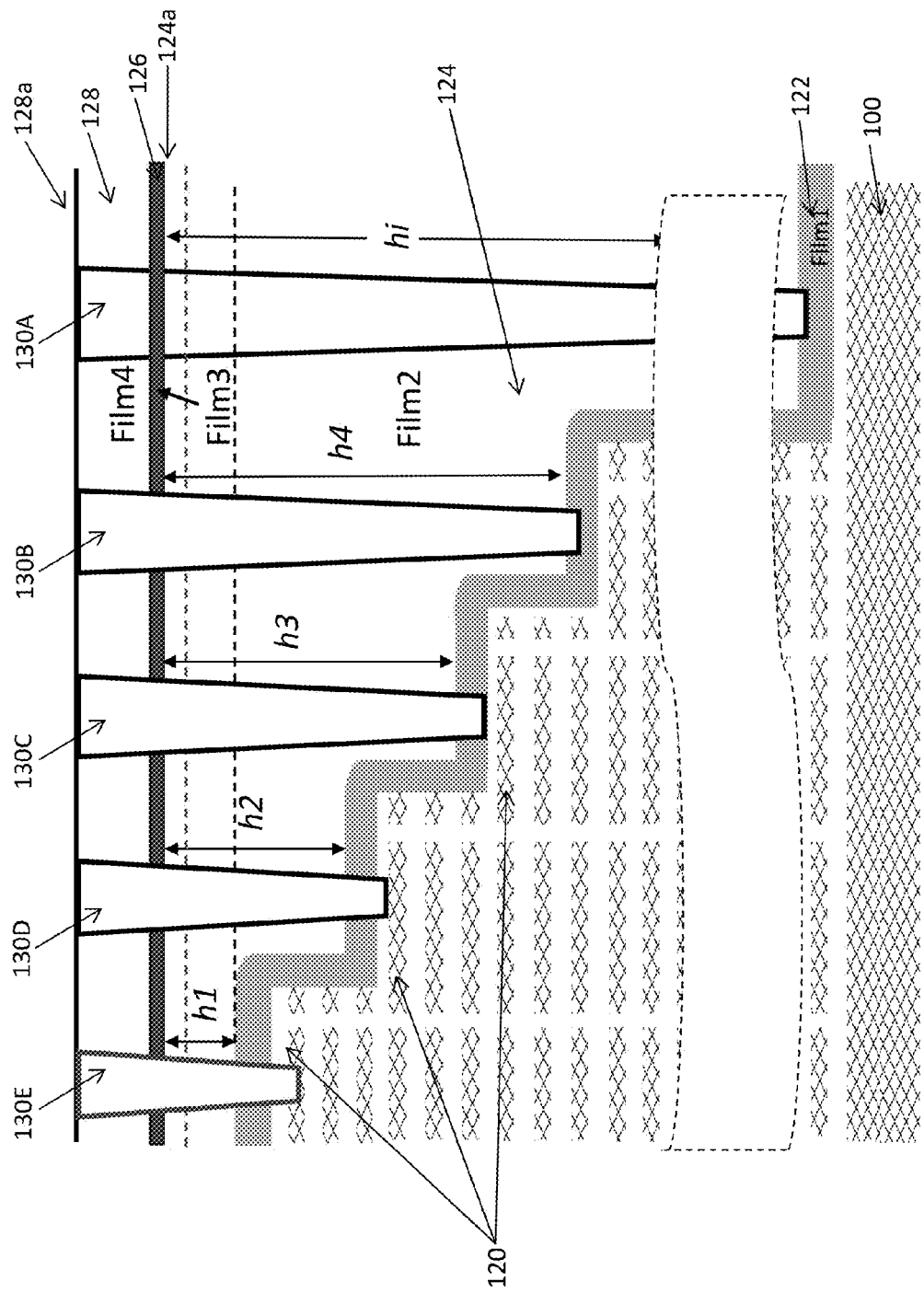
FIG. 5 is a schematic illustration of a conventional method of making a multi-level contact.

FIG. 5 illustrates the problem of shallow side over etching with the conventional method of making the multi-level contact of FIG. 4 discussed above. In the conventional method, the control gate steps 120 are covered with a stack of layers of dielectric (electrically insulating) materials. The first dielectric layer is a conformal etch stop layer 122. The conformal etch stop layer 122 may be made of any suitable material, such as silicon nitride. The conformal etch stop layer 122 is covered with a second dielectric layer 124, made of a different material than layer 122. The second dielectric material may be made of any suitable material including oxides, such as silicon oxide (e.g., $SiO_2$). The second dielectric layer 124 is not conformal. That is, the thickness (h1, h2, h3, h4 . . . hi) of the dielectric layer 124 varies over each step 120 such the upper surface 124a of the second dielectric layer 124 is the same distance from the substrate 100 over all of the steps 120. A third dielectric layer, sacrificial barrier layer 126, is deposited over the second dielectric layer 124. The sacrificial barrier layer 126 may be made of any suitable material, such as silicon nitride (e.g. preferably the same material as conformal etch stop layer 122 but a different from material the second dielectric layer 124). A fourth dielectric layer 128 is then deposited over the sacrificial barrier layer 126. The fourth dielectric layer 128 may be made of any suitable material including oxides, such as silicon oxide, (e.g., $SiO_2$).

To make the contacts to the control gate steps 120, openings 130A-130E are etched from the top surface 128a of the fourth dielectric layer 128 through the fourth dielectric layer 128, the sacrificial barrier layer 126 and the second dielectric layer 124. Typically, the fourth dielectric layer 128 and the sacrificial barrier layer 126 are non-selectively etched (i.e., etched with an etchant that etches all materials at essentially the same rate) in a first etching step. Then the second dielectric layer 124 is selectively etched (i.e., etched with an etchant that etches one material (e.g. the second dielectric material 124) substantially faster (e.g., 2-10× or more faster) than the underlying material (e.g., etch stop layer 122)) so that the openings stop on the etch stop layer 122.

However, when etching the openings 130A-130E, it is not uncommon that the shallower openings (e.g., 130E, 130D, 130C) will penetrate the etch stop layer 122 prior to the longer openings (e.g. 130A) reaching the etch stop layer 122. This especially problematic as the number of levels (steps) increases. The number of levels in a multilevel memory device, such as a multi-level NAND device, is unlimited and may include, for example, 2-256 levels, such as 4-128 levels such as, 8-64 levels, such as 16-32 levels. The contacts are completed by depositing an electrically conducting material, such as Cu, Al, their alloys or a silicide (e.g., Ti, Ni or Co silicide) into the openings 130A-130E.

Figure 6:
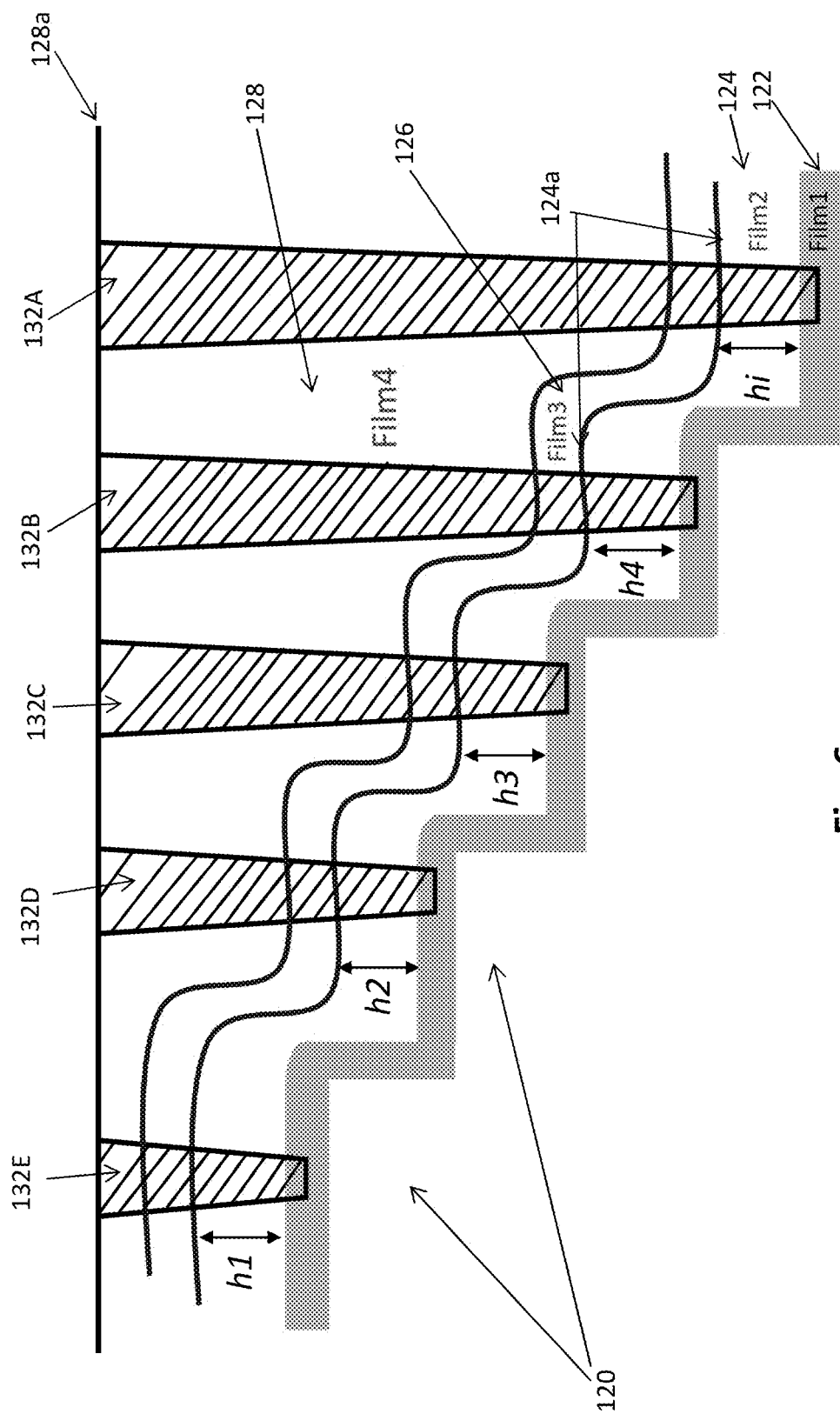
FIG. 6 is a schematic illustration of a method of making a multi-level contact according to an embodiment.
Figure 7:
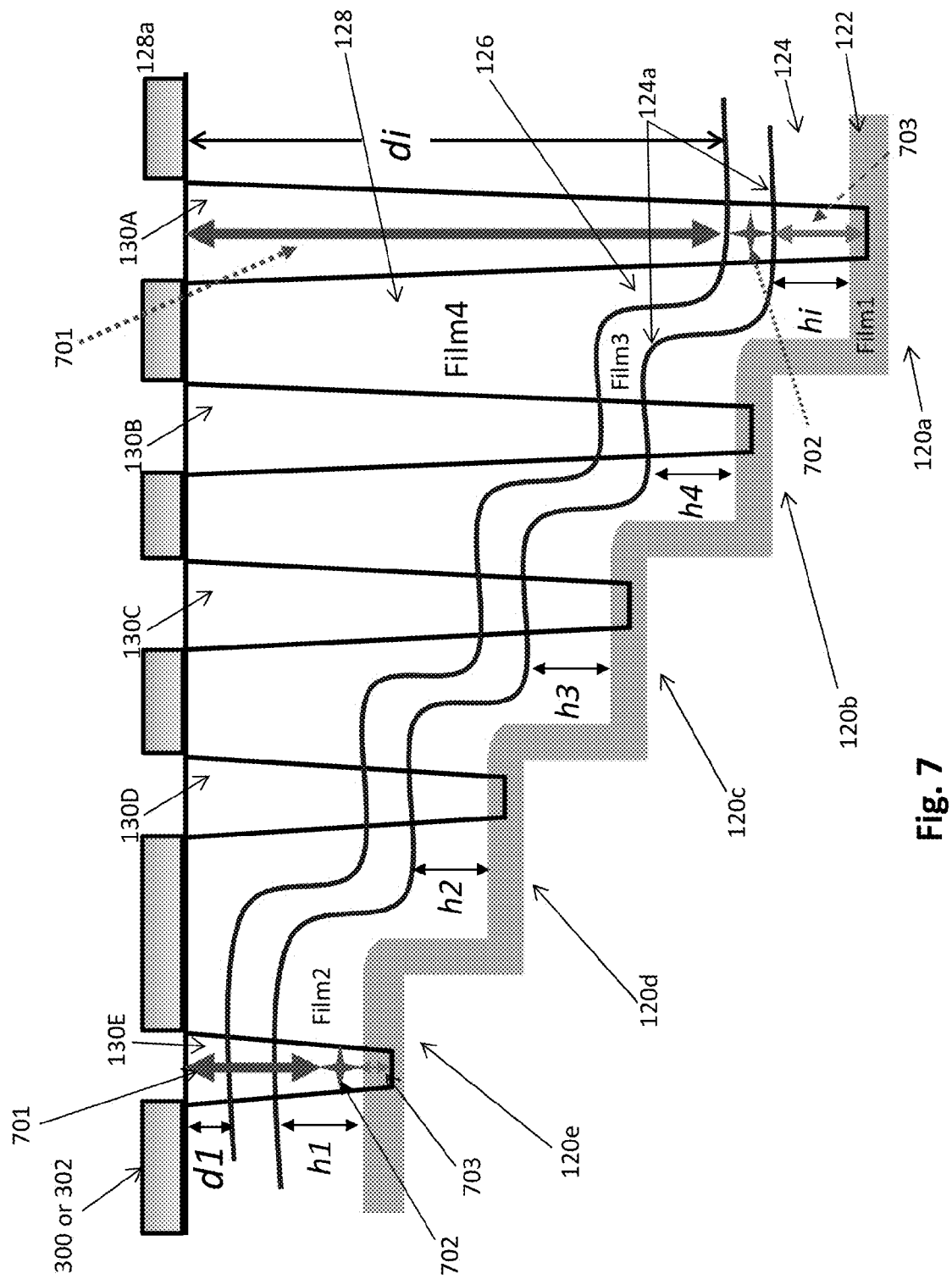
FIG. 7 is a schematic illustration providing additional details of the method of FIG. 6.

FIGS. 6 and 7 are schematic illustrations of a first embodiment method of making a multi-level contact. In this embodiment, the control gate steps 120 are covered with a stack of dielectric materials including: an etch stop layer 122, the second dielectric layer 124, the sacrificial barrier layer 126, and the fourth dielectric layer 128 described above. However, in contrast to the conventional stack of FIG. 5, the second dielectric layer 124 is a conformal layer. That is, the thicknesses (h1, h2, h3, h4 . . . hi) of the second dielectric layer 124 are substantially the same (e.g., h1≈h2≈h3≈h4≈hi) over all of the steps 120 and the shape of the top surface 124a of the second dielectric layer 124 follows the steps 120. In addition in this embodiment, the sacrificial barrier layer 126 is also preferably conformal (e.g. has the same thickness over all steps 120). Preferably, layers 122 and 126 are made of the same first material and layers 124 and 128 are made of the same second material different from the first material. In an embodiment, the etch stop layer 122, and the sacrificial barrier layer 126 are made of a nitride, such as silicon nitride. Other materials may be used as well. The second dieleclayer 124 and the fourth dielectric layer 128 may be made of an oxide, such as silicon oxide. Other dielectric materials may be used as well.

In a first step in this embodiment, the fourth dielectric layer 128 is selectively etched (i.e., etched with an etchant (having a first etch chemistry) that etches the material of the fourth dielectric layer 128 faster than the material of the sacrificial barrier layer 126) in a first etching step 701 through holes in a photoresist or other mask 300, 302 shown in FIG. 7. The longer openings (e.g. 130A, 130B) stop on the sacrificial barrier layer 126. The shallower openings (e.g. 130E, 130D, 130C) may completely penetrate the sacrificial barrier layer 126. However, because a selective etch is used in this step, the rate of etching of the shallower openings 130E, 130D, 130C slows down when the selective etchant reaches the barrier layer 126, resulting in a relatively small over etch into the second dielectric layer 124 in the first etching step 701. Thus, a first etch chemistry may be used to selectively etch first portions of a plurality of the contact openings 130A-130E through the fourth dielectric layer 128 using the sacrificial barrier layer 126 as an etch stop.

In a second etching step 702, the barrier layer 126 in the longer openings 130A, 130B is selectively etched (i.e., etched with an etchant that etches the material of the sacrificial barrier layer 126 faster than the material of the second dielectric layer 124). Etching is stopped when the longer openings 130A, 130B reach the second dielectric layer 124. Because the second etching step 702 also uses a selective etch, the continued etching of the shallow openings 130E, 130D, 130C in the second dielectric layer 124 is relatively slow relative to the removal of the sacrificial barrier layer 126 from the longer openings 130A, 130B. Preferably, all of the openings 130A-130E are stopped in the second dielectric layer 124. Thus, a second etch chemistry may be used to selectively etch second portions of the plurality of the contact openings 130A-130E through the sacrificial barrier 126 layer using the second dielectric layer 124 as an etch stop.

In a third etching step 703, the second dielectric layer 124 is selectively etched (i.e., etched with an etchant that etches the material of the second dielectric layer 124 faster than the material of the etch stop layer 122). Etching is stopped when the second dielectric layer 124 is removed from the longer openings 130E, 130D, 130C (i.e., when reaching the etch stop layer 122). As a result of using a conformal second dielectric layer 124 and a conformal sacrificial barrier layer 126 in conjunction with multiple selective etching steps, the difference in depth of the last etch is minimized. The longer openings 130A, 130B can be formed without punching through the etch stop layer 122 to the control gate steps 120 in the shallow openings 130E, 130D, 130C. Thus, a third etch chemistry may be used to selectively etch third portions of the contact openings 130A-130E through the second dielectric layer 124 using the conformal etch stop layer 122 as an etch stop. The etch stop layer 122 on shallowest step 120a is not punched through when etching is complete to the etch stop layer over the deepest step 120e.

A fourth etch step may be performed to remove the etch stop layer 122 in the openings 130A-130E and thereby provide vias from the top surface 128a of the fourth dielectric layer 128 to the control gate steps 120. Thus, a fourth etch chemistry may be used to selectively etch fourth portions of the contact openings 130A-130E through the conformal etch stop layer 122 to reach the electrically conductive layers 120.

In an embodiment, the first etch and the third etch chemistries are the same, the second etch and the fourth etch chemistries are the same and the first and the second etch chemistries are different. The selective etch for silicon oxide (e.g., layers 124 and 128) may have a selectivity of 13-15 times over silicon nitride (e.g., layers 122, 126), while the selective etch for silicon nitride may have a selectivity of 4-6 times over silicon oxide.

In an embodiment, each of the conformal etch stop layer 122, the second dielectric layer 124 and the sacrificial barrier layer 126 has a substantially uniform thickness and each is arranged in the step pattern over the plurality of electrically conductive layers 120 in the contact region 134. The fourth dielectric layer 128 has a variable thickness and a substantially planar upper surface 128a. The fourth dielectric layer 128 is thicker over the first portion of the first conductive layer (e.g., step 120e) than over the second conductive layer (e.g., step 120d). A shallowest step 120a is located a shortest distance from a top surface 128a of the fourth dielectric layer 128 in an etch direction. A deepest step 120e is located a greatest distance from the top surface 128a of the fourth dielectric layer 128 in the etch direction.

As discussed above, the contacts 132A-132E may be formed by depositing an electrically conducting material, such as Cu, Al, their alloys or a silicide (e.g., Ti, Ni or Co silicide) into the openings 130A-130E. For example, forming a first electrically conductive contact 132A in the first contact opening 130A and a second electrically conductive contact 132B in the second contact opening 130B (where the first electrically conductive contact 132A extends deeper than the second electrically conductive contact 132B). A plurality of electrically conductive contacts 132 may be formed in which each respective one of the plurality of electrically conductive contacts 132 is located in a respective one of the plurality of contact openings 130 and each electrically conductive contact 132 is in electrical contact with a respective one of the plurality of electrically conductive layers 120.

Figure 8:
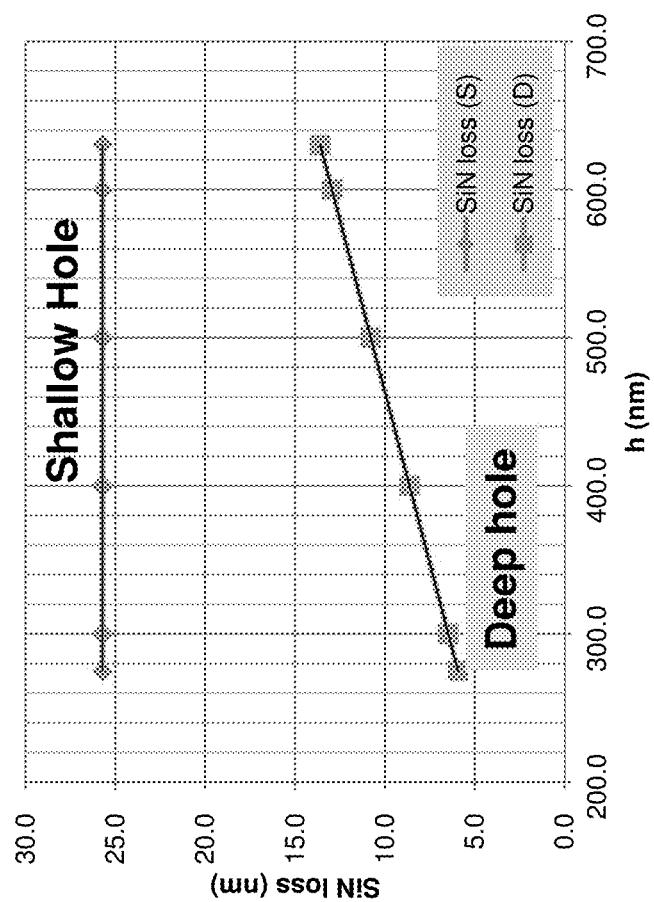
FIG. 8 is a plot illustrating the loss of thickness of the first (lower) dielectric layer as a function of thickness of the second conformal dielectric layer according to an embodiment.

FIG. 8 illustrates the loss of thickness of the etch stop layer 122 as a function of thickness of the conformal second dielectric layer 124 according to an embodiment. In these simulations, the thickness of the sacrificial barrier layer 126 is fixed at 150 nm and the depth of holes 130A and 130E is 2480 nm and 780 nm, respectively. FIG. 8 demonstrates that the loss of etch stop layer 122 in the shallow openings remains constant (less than 30 nm, such as 25-29 nm) for a range of thickness of the conformal second dielectric layer 124 of approximately 275-630 nm. Use of a thicker conformal second dielectric layer 124 results in an increase in the loss of etch stop layer 122 material from deeper openings. However, the losses from the deeper openings are always less than the material loss from the shallow openings (e.g., a difference in loss less than 20 nm, such as less than 12-19 nm). Thus, the sacrificial barrier layer 126 may be at least 150 nm thick, such as 15-250 nm thick. The second dielectric layer 124 may be from 275-630 nm thick.

Figure 9A:
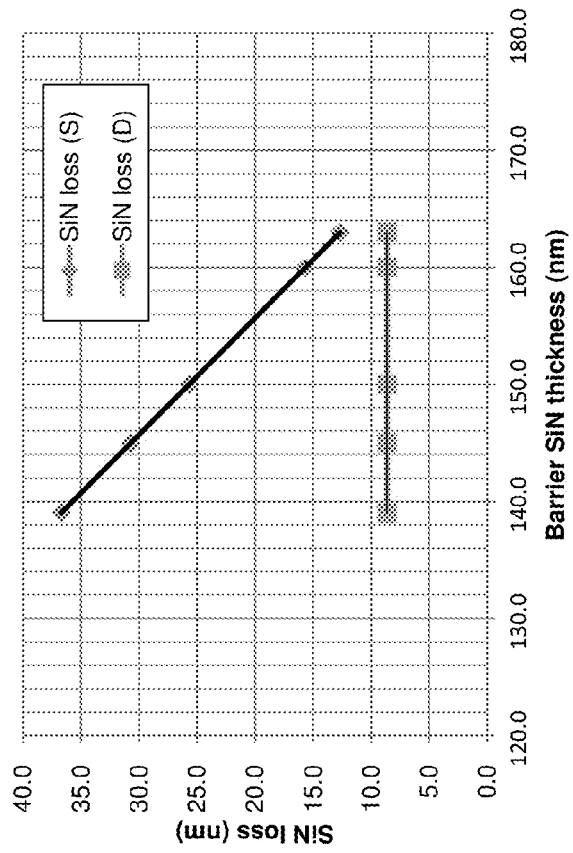
FIG. 9a is a plot illustrating the loss of thickness of the first (lower) dielectric layer as a function of thickness of the third conformal dielectric layer for a second conformal layer with a thickness of 600 nm.
Figure 9B:
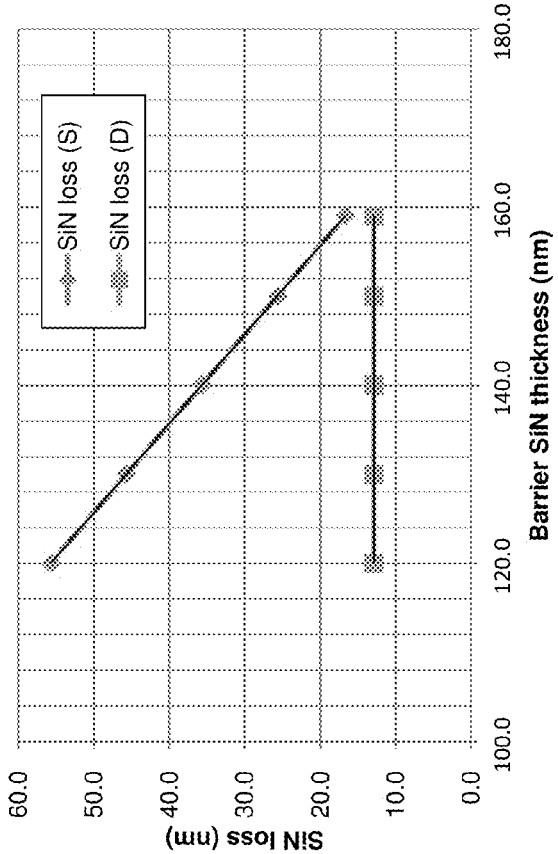
FIG. 9b is a plot illustrating the loss of thickness of the first (lower) dielectric layer as a function of thickness of the third conformal dielectric layer for a second conformal layer with a thickness of 400 nm.

FIGS. 9a and 9b illustrate the loss of thickness of the etch stop layer 122 as a function of thickness of the sacrificial barrier layer 126 for (a) a second conformal layer with a thickness of 600 nm and (b) a second conformal layer with a thickness of 400 nm. As shown in the figures, the loss in thickness of the etch stop layer 122 decreases with increasing thickness of the sacrificial barrier layer 126 for the shallow openings. Further, the loss in thickness of the etch stop layer 122 in the deep openings is insensitive to the thickness of the sacrificial barrier layer 126.

FIGS. 10a-10h illustrate a method of making a multi-level contact according to another embodiment. FIGS. 10a, 10c, 10e and 10g are side cross sectional views illustrating steps in the method while FIGS. 10b, 10d, 10f, and 10h are top cross sectional views corresponding to FIGS. 10a, 10c, 10e and 10g, respectively. The steps illustrated in FIGS. 10a-10h are performed subsequent to fabricating the device structures illustrated in FIGS. 1 and 2. That is, the multi-level contacts are fabricated on an in-process device.

The multi-level contact region includes a plurality of electrically conductive layers configured in a step pattern 120. The multi-level contact region in this embodiment also includes an electrically insulating layer (e.g. second dielectric layer 124) located over the electrically conductive layers 120. The multi-level contact region may also optionally include an etch stop layer 122 located between the electrically conductive layers 120 and the electrically insulating layer 124. In this embodiment, sacrificial barrier layer 126 and fourth dielectric layer 128 may be omitted. Located over the electrically insulating layer 124 is a mask 300 (e.g., a hard mask, such as one or more layers of silicon oxide, silicon nitride, polysilicon, etc) with a plurality of openings 304A-304E. A slimming layer 302 (e.g., a photoresist or other material that can have its width and thickness slimmed by etching or ashing) is located over the mask 300.

Figures 10A, 10B:
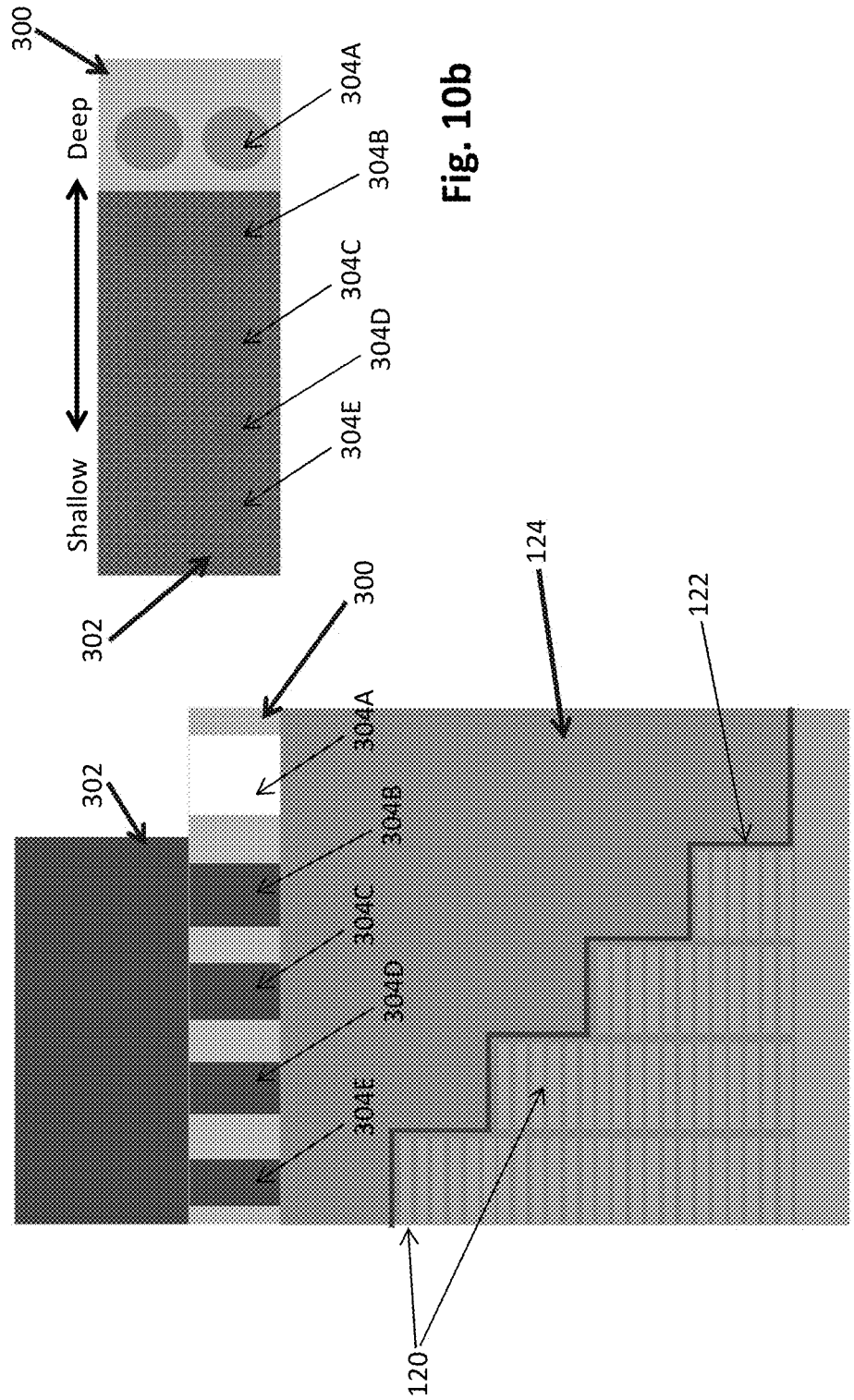
FIGS. 10a-10b are respectively side cross sectional and top cross sectional views of a step in a method making a multi-level contact according to an embodiment.

In the non-limiting embodiment illustrated in FIGS. 10a and 10b, the openings 304A-304E progressively decrease in diameter with the largest diameter opening 304A located over the deepest step 120 and the smallest diameter opening 304e located over the shallowest opening 304E. This is advantageous as etching proceeds faster in larger diameter openings than in smaller diameter openings. Thus, additional control over the etching process may be exercised by using openings of differing diameters. As illustrated, the multi-level contact region includes five levels 120. However, as discussed above, the number of levels in a multilevel memory device, such as a multi-level NAND device, is unlimited and may include for example, 2-256 levels, such as 4-128 levels such as, 8-64 levels, such as 16-32 levels.

As illustrated in FIGS. 10a and 10b, the method includes etching or partially ashing the slimming layer 302 to reduce its thickness and width to expose the first opening 304A in the mask 300. The other openings 304B-304E remain covered by the reduced thickness/width slimming layer 302. As illustrated in FIGS. 10c-10d, the electrically insulating material 124 exposed in the first opening 304A may be etched to form a portion of a first contact opening 130A in the electrically insulating material 124. Then, as illustrated in FIGS. 10e and 10f, the slimming layer 302 may be etched or partially ashed to reduce its thickness and width and to expose a second opening 304B in the mask 300. As illustrated in FIGS. 10g-10h, the electrically insulating material 124 exposed in the first and second openings 304A, 304B may be etched to form a portion of a second contact opening 130B and further extend the contact opening 130A in the electrically insulating material 124. The etching and slimming steps may then repeated until contact openings 130A-130E in the electrically insulating material 124 (and layer 122, if present) are formed for each step 120. For example, the slimming layer 302 may be further etched or ashed to reduce its thickness and width to expose a third opening in the mask 300 and to etch a portion of the electrically insulating material 124 exposed in the first and second openings 130A, 130B to form a first portion of the second contact opening 130A and a second portion of the first contact opening 130A in the electrically insulating material. The first contact opening 130A is deeper than the second contact opening 130B. After forming all of the openings 130A-130E, a conducting material, such as Cu, Al, alloys or a silicide may be deposited in the openings 130A-130E to form the contacts 132 to each step 120. The method may include continuing to etch the slimming layer 302 until all of the plurality of openings 130A-130E in the mask 300 are exposed and a respective one of a plurality of contact openings is etched through each opening in the mask 300 to the plurality of electrically conductive layers 120a-120e.

In an embodiment, the electrically insulating material 124 and the slimming layer 302 may be etched simultaneously in the same etching step using the same etch chemistry. In another embodiment, the electrically insulating material 124 and the slimming layer 302 are etched in different steps using different etch chemistries.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A multilevel device, comprising:
at least one device region and at least one contact region having a plurality of stacked electrically conductive layers, wherein the electrically conductive layers form a stepped pattern in the contact region;
a conformal etch stop layer located over the electrically conductive layers;
a first electrically insulating layer located over the etch stop layer;
a conformal sacrificial layer located over the first electrically insulating layer;
a second electrically insulating layer located over the sacrificial layer;
a plurality of contact openings extending through the etch stop layer, the first electrically insulating layer, the sacrificial layer and the second electrically insulating layer in the contact region to the plurality of electrically conductive layers; and
a plurality of electrically conductive contacts, wherein each respective one of the plurality of electrically conductive contacts is located in a respective one of the plurality of contact openings, and each electrically conductive contacts is in electrical contact with a respective one of the plurality of electrically conductive layers;
wherein:
the plurality of electrically conductive layers comprise at least a first conductive layer in a first device level located over a substrate and a second conductive layer in a second device level located higher than the first device level over the substrate;
the first conductive layer comprises a first portion which laterally extends past the second conductive layer to form at least a portion of the step pattern;
the plurality of contact openings comprises a first contact opening which extends to the first portion of the first conductive layer and a second contact opening which extends to an upper surface of the second conductive layer;
a first electrically conductive contact of the plurality of electrically conductive contacts is located in the first contact opening;
a second electrically conductive contact of the plurality of electrically conductive contacts is located in the second contact opening;
in the first electrically conductive contact extends deeper than the second electrically conductive contact;
each of the conformal etch stop layer, the first electrically insulating layer and the sacrificial layer has a substantially uniform thickness and each is arranged in the step pattern over the plurality of electrically conductive layers in the contact region;

the second electrically insulating layer has a variable thickness and a substantially planar upper surface; and the second electrically insulating layer is thicker over the first portion of the first conductive layer than over the second conductive layer.

2. The device of claim 1, wherein:

the conformal etch stop layer and the conformal sacrificial layer comprise the same material;

the first and the second electrically insulating layers comprise the same material; and the conformal sacrificial layer comprises a different material from that of the first electrically insulating layer.

3. The device of claim 2, wherein:

the conformal etch stop layer and the conformal sacrificial layer comprise the same nitride material; and the first and the second electrically insulating layers comprise the same oxide material.

4. The device of claim 3, wherein the etch stop layer comprises silicon nitride, the first electrically insulating layer comprises silicon oxide, the sacrificial layer comprises silicon nitride, and the second electrically insulating layer comprises silicon oxide.

5. The method of claim 1, wherein:

the device comprises a vertical NAND device;

the device region comprises:

a plurality of semiconductor channels, wherein at least one end portion of each of the plurality of semiconductor channels extends substantially perpendicular to a major surface of the substrate;

a plurality of charge storage regions, each charge storage region located adjacent to a respective one of the plurality of semiconductor channels; and a plurality of control gate electrodes having a strip shape extending substantially parallel to the major surface of the substrate, wherein the plurality of control gate electrodes comprise at least a first control gate electrode located in the first device level and a second control gate electrode located in the second device level;

the first conductive layer comprises a portion of the first control gate electrode which extends from the device region to the contact region; and the second conductive layer comprises a portion of the second control gate electrode which extends from the device region to the contact region.

6. The device of claim 1, wherein:

the vertical NAND device comprises an array of monolithic three dimensional NAND strings located over a silicon substrate;

at least one memory cell in the first device level of the three dimensional array of NAND strings is located over another memory cell in the second device level of the three dimensional array of NAND strings; and the silicon substrate contains an integrated circuit comprising a driver circuit for the memory device located thereon.

* * * * *